United States Patent
Kawashima et al.

(10) Patent No.: US 6,292,418 B1
(45) Date of Patent: Sep. 18, 2001

(54) SEMICONDUCTOR MEMORY DEVICE

(75) Inventors: Shoichiro Kawashima; Isao Fukushi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/199,271

(22) Filed: Nov. 25, 1998

(30) Foreign Application Priority Data

Nov. 27, 1997 (JP) .................................................. 9-326809

(51) Int. Cl.[7] .................................................. G11C 7/00
(52) U.S. Cl. .................................. 365/205; 365/203
(58) Field of Search .................................. 365/203, 205, 365/207, 208, 190

(56) References Cited

U.S. PATENT DOCUMENTS

| | | | |
|---|---|---|---|
| 4,069,474 | * 1/1978 | Boettcher et al. | 365/205 |
| 4,379,344 | * 4/1983 | Ozawa et al. | 365/203 |
| 4,397,003 | * 8/1983 | Wilson et al. | 365/205 |
| 4,421,996 | * 12/1983 | Chuang et al. | 365/205 |

* cited by examiner

Primary Examiner—Trong Phan
(74) Attorney, Agent, or Firm—Staas & Halsey LLP

(57) ABSTRACT

A semiconductor memory device includes a memory cell, and a dynamic latch type sense amplifier including transistors that form not only a dynamic latch circuit which holds or releases data but also charge transfer gates via which charges are applied to or received from bit lines. Data is read from the cell connected to the bit lines at a same time as a precharging operation on the bit lines.

19 Claims, 8 Drawing Sheets

SEMICONDUCTOR MEMORY DEVICE

BACKGROUND OF THE INVENTION

1. Field of the Invention

The present invention generally relates to semiconductor memory devices, and more particularly to a semiconductor memory device equipped with a dynamic latch type sense amplifier which amplifies complementary signals. The dynamic latch type sense amplifier is configured as follows. The potentials of capacitances coupled to a pair of bit lines connected to a cell (memory element) are set equal to each other before data is read from the cell. When the data is read from the cell, the fine potential difference between the pair of bit lines is amplified by a flip-flop type circuit, and amplified data is output.

Recently, it has been required that the semiconductor memory devices such as SRAM (Static Random Access Memory) devices have a reduced cell data read time and a reduced power consumption as the electronic devices equipped with the semiconductor memory devices have advanced performance.

2. Description of the Related Art

A conventional semiconductor device will be described with reference to FIGS. 1, 2 and 3.

FIG. 1 is a block diagram illustrating the overall structure of an SRAM device.

The SRAM device is equipped with a memory cell array 10, a row address buffer 12, a row decoder 14, a word driver 16, a column address buffer 18, a column decoder 20, a column select switch 22, a sense amplifier 24C, an input/output data control circuit 26, a chip enable buffer 28, a write enable buffer 30, a precharge power source 32C and a timing generator 33. The memory cell array 10 has memory elements or cells that are arranged in a matrix formation and function to store data in static fashion.

A row address signal and a column address signal are temporarily stored in the row address buffer 12 and the column address buffer 18, respectively, and are then output to the row decoder 14 and the column decoder 20.

The decoded row address signal is input to the word driver 16. and the decoded column signal is input to the column select switch 22. Thus, the cell specified by the row and column addresses is selected from among the cells of the memory cell array 10. Then, data is read from or written into the selected cell. At that time, the sense amplifier 24C functions to amplify the data read from the selected cell. The amplified data signal is output via the input/output data control circuit 26.

A chip enable signal selects one of a plurality of SRAM devices (chips) which configure a memory system. When the SRAM devices are set to be in the non-selected or disabled states by the respective chip enable signals, all the internal circuits of the SRAM devices are in the disabled states. Hence, power consumed in the memory system can be reduced. A write enable signal is an external input signal that controls a data write/read operation on the memory cell array 10.

The chip enable signal and the write enable signals are input to the input/output data control circuit 26 via the chip enable buffer 28 and the write enable buffer 30, respectively. The precharge power source 32C is connected to the sense amplifier 24C, and sets the sense amplifier 24C to a given potential VCCH (precharge potential).

The timing generator 33 generates reference or timing signals used to pull the operation timings of the circuits in the SRAM device in phase. The reference signals are generated by a synchronizing signal externally supplied to the SRAM device, and are then applied to, for example, the buffers and sense amplifier 24C.

Next, the sense amplifier 24C will be described with reference to FIGS. 2 and 3.

FIG. 2 exemplary shows the sense amplifier 24C and a cell (cell C) connected to a pair of bit lines BLX and BLZ. The sense amplifier 24C includes n-channel MOS (Metal Oxide Semiconductor) transistors Q1, Q2, Q3 and Q4. The cell C includes p-channel MOS transistors P7 and P8 and nMOS transistors Q7, Q8, Q9 and Q10.

The precharge power source 32C applies a potential VCC-PC (for example, 1.5 V) to the sense amplifier 24C. The transistors P1 and P2 connected to the precharge power source 32C are used to precharge the bit lines BLX and BLZ, respectively. A precharge control signal PCZ generated by the timing generator 33 is applied to the gates of the transistors P1 and P2.

The gates of the transistors Q1 and Q2 are connected to the drains of the transistors Q2 and Q1, respectively, and form a flip-flop circuit. The sources of the transistors Q1 and Q2 are respectively connected to nodes NX and NZ.

The transistors Q3 and Q4 function as pull-down transistors in which the sources thereof are set at the ground potential GND. The transistors Q5 and Q6 function as charge transfer transistors in which the drains thereof are connected to output terminals OUTX and OUTZ and the sources thereof are connected to the bit lines BLX and BLZ, respectively.

The output terminals OUTX and the OUTZ are connected to the input/output data control circuit 26 shown in FIG. 1. The gates of the transistors Q3 and Q4 are supplied with a sense enable signal Enx from the timing generator 33 shown in FIG. 1. The gates of the transistors Q5 and Q6 are supplied with a column select signal CLx from the column decoder 20 shown in FIG. 1.

The gates of the transistors P5 and P6 are supplied with a bit line reset signal BLRST generated by the timing generator 33. When the bit line reset signal BLRST is at the ground potential GND, the transistors P5 and P6 are turned on and the bit lines BLX and BLZ are reset to the potential VCC.

The cell C is made up of the transistors P7, Q7, P8 and Q8 which form a flip-flop circuit, and nMOS transistors Q9 and Q10 for use in the read/write operations. The signal transferred over the word line WL is applied to the gates of the transistors Q9 and Q10. When the transistors Q9 and Q10 are turned on, the potential of the bit line BLX or BLZ is pulled down in accordance with the state of the flip-flop circuit. Hence, data stored in the cell C can be read. The potential difference between the bit lines BLX and BLZ is amplified by the sense amplifier 24C. When a large amplitude of the bit line potential difference is applied through the transistors Q9 and Q10, data can be written into the flip-flop circuit.

After a standby period, the sense amplifier 24C charges the capacitances coupled to the bit lines BLX and BLZ during a precharge period. After that, the signal on the word line is applied to the cell C during a cell read period, and the data is read from the cell C. The read data is amplified by the sense amplifier 24C during a sense period.

FIG. 3 shows the above-mentioned cycle, in which voltages and signals are illustrated to describe the operation of the sense amplifier 24C shown in FIG. 2.

During the standby period, the precharge control signal PCZ is at the ground level GND, and the pMOS transistors P1 and P2 for use in precharging are on. Hence, the output terminals OUTX and OUTZ are precharged to the potential VCCH.

During the precharge period following the standby period, the gates of the pMOS transistors P5 and P6 are supplied with the bit line reset signal BLRST of the potential VCC (high level) to which the bit lines BLX and BLZ are reset. Hence, the transistors P5 and P6 are off.

At that time, the column select signal CLx of the high-level potential VCCH (>VCC) is applied to the gates of the nMOS transistors QS and Q6, which are thus turned on. Hence, the bit lines BLX and BLZ are charged via the transistors Q5 and Q6 from the transistors P1 and P2. In that manner, the bit lines BLX and BLZ are precharged. The potentials of the bit lines BLX and BLZ after the precharging are lower than the potential VCCH by the threshold voltages Vth of the transistors Q5 and Q6.

During the cell read period, the precharge control signal PCZ is set to the potential VCCH (high level) so that the transistors P1 and P2 are turned off. At that time, when the signal of the potential VCCH (high level) is transferred over the word line WL, the transistor Q9 and Q10 are turned on, and the potential of one of the bit lines BLX and BLZ (for example, BLZ) is pulled down.

When the potential of the bit line BLZ is decreased, the gate-source voltage VGS of the transistor Q6 having the source connected to the bit lie BLZ becomes greater than the threshold voltage Vth (VGS>Vth), the transistor Q6 is turned on. Hence, the drain (OUTZ) of the transistor Q6 that was potentially in the floating state is decreased. At that time, the gate-source voltage VGS of the transistor Q5 is approximately equal to the threshold voltage Vth, and is approximately off. Hence, the output terminal OUTX is maintained at the potential VCCH previously precharged.

The potential difference between the output terminals OUTX and OUTZ becomes larger than the difference (approximately equal to 0.1 V) between the threshold voltages Vth by reading the data from the cell.

During the sense period, the gates of the nMOS transistors Q3 and Q4 for use in the pull-down operation are supplied with the sense enable signal Enx of the potential VCC (high level). Hence, the transistors Q3 and Q4 are turned on. At that time, the column select signal CLx is set to the ground potential GND, and the transistors Q5 and Q6 are turned off. Hence, the bit lines BLX and BLZ are electrically isolated.

Since the potential difference between the output terminals OUTX and OUTZ is already set equal to or greater than the mismatch value of the threshold voltages Vth of the transistors Q1 and Q2 during the cell read period, the dynamic latch formed of the transistors Q1 and Q2 is activated when the transistors Q3 and Q4 are turned on. Hence, a current flows in a route including the output terminal OUTZ, the transistor Q2 and the transistor Q4 in this order. Thus, the output terminal OUTZ is decreased to the ground potential GND. The gate potential of the transistor Q1 is decreased and is thus retained in the off state, and the potential of the output terminal OUTX is kept high.

As described above, the sense amplifier 24C precharges the bit lines BLX and BLZ and thus sets the gate-source voltages VGS of the transistors Q5 and Q6 to be approximately equal to the threshold voltages Vth. Additionally, the flip-flop circuit causes the potential difference between the output terminals OUTX and OUTZ to be equal to or greater than the mismatch value of the threshold voltages Vth of the transistors Q1 and Q2. Then, the potential latch is carried out. Thus, the potential differences between the transistors Q1 and Q2 and between the transistors Q5 and Q6 can be compensated for.

It takes about 10 ns to precharge the bit lines BLX and BLZ by setting, in the precharge period, the potential of the column select signal CLx to the high level so that the charge transfer gates Q5 and Q6 are turned on. This prevents the total operation time from being reduced. Further, since the potential of the precharge power source 32C is always maintained at the potential VCCH (>VCC), there are the potential differences between the output terminals OUTX and OUTZ and between the bit lines BLX and BLZ even during the standby period and the sense period in which periods the charge transfer gates Q5 and Q6 are closed. The above potential differences result in a fine leakage current, which increases power consumption of the semiconductor device.

SUMMARY OF THE INVENTION

It is a general object of the present invention to provide a semiconductor memory device in which the above disadvantages are eliminated.

A more specific object of the present invention is to provide a semiconductor memory device equipped with a sense amplifier capable of reading data with a reduced time.

Another object of the present invention is to provide a semiconductor memory device in which the voltage of a precharge power source is controlled in accordance with an operation of a sense amplifier so that occurrence of a leakage current can be prevented and power consumption can be reduced.

The above objects of the present invention are achieved by a semiconductor memory device comprising: a memory cell; and a dynamic latch type sense amplifier including transistors (Q1, Q2) that form not only a dynamic latch circuit which holds or releases data but also charge transfer gates via which charges are applied to or received from bit lines, data being read from the cell connected to the bit lines at a same time as a precharging operation on the bit lines. Since the precharging and the cell read can simultaneously be carried out whereby the total data read time can be shortened.

The semiconductor memory device may be configured so that it further comprises a power source which applies a precharging potential to the bit lines at the time of precharging and applies a given potential lower than the precharging potential to the bit lines at a time other than the time of precharging. During periods other than the precharging period, the same potentials as the potentials of the bit lines are applied to the sense amplifiers, so that occurrence of a leakage current can be prevented.

The semiconductor memory device may be configured so that the transistors are two transistors connected in cross-coupled formation with respect to the bit lines.

The above objects of the present invention are also achieved by a semiconductor memory device comprising: a memory cell; and a sense amplifier of a dynamic latch type including first and second n-channel transistors which have drains connected to first and second output terminals of the sense amplifier, respectively, gates connected to the second and first output terminals, respectively, and sources connected to first and second bit lines, respectively. Hence, it is possible to provide the semiconductor device equipped with the sense capable of simultaneously performing the precharging operation and the cell read operation.

The semiconductor memory device may be configured so that the sense amplifier further comprises third and fourth n-channel transistors which have gates receiving a common control signal, drains connected to the sources of the first and second n-channel transistors, respectively and sources connected to a given potential.

The semiconductor memory device may be configured so that the sense amplifier further comprises first and second p-channel transistors which have gates receiving a common control signal, sources connected to the sources of the first and second n-channel transistors, respectively, and drains connected to the first and second bit lines, respectively.

The semiconductor memory device may be configured so that the sense amplifier further comprises first and second p-channel transistors which have gates receiving a common control signal, sources connected to the sources of the first and second n-channel transistors, respectively, and drains connected to the first and second bit lines, respectively.

The semiconductor memory device may be configured so that the sense amplifier further comprises third and fourth p-channel transistors which have gates receiving a common precharge control signal, sources connected to a given power source, and drains connected to first and second output terminals of the sense amplifier, respectively.

The semiconductor memory device may be configured so that the cell is an SRAM cell.

The semiconductor memory device may be configured so that it further comprises a power source which applies a percharging potential to the bit lines at the time of precharging and applies a given potential different from the precharging potential to the bit lines at a timer other than the time of precharging.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of semiconductor memory devices according to embodiments of the present invention.

A first embodiment of the present invention is based on the following principle. Two transistors of a dynamic latch type sense amplifier which amplifies a potential difference appearing on bit lines in an SRAM device also function as precharging transistors and cross-coupled transistors for potential latch. At the same time as the bit lines are precharged, data is read from a selected cell. Hence, the operation cycle can be speeded up.

Figure 1:
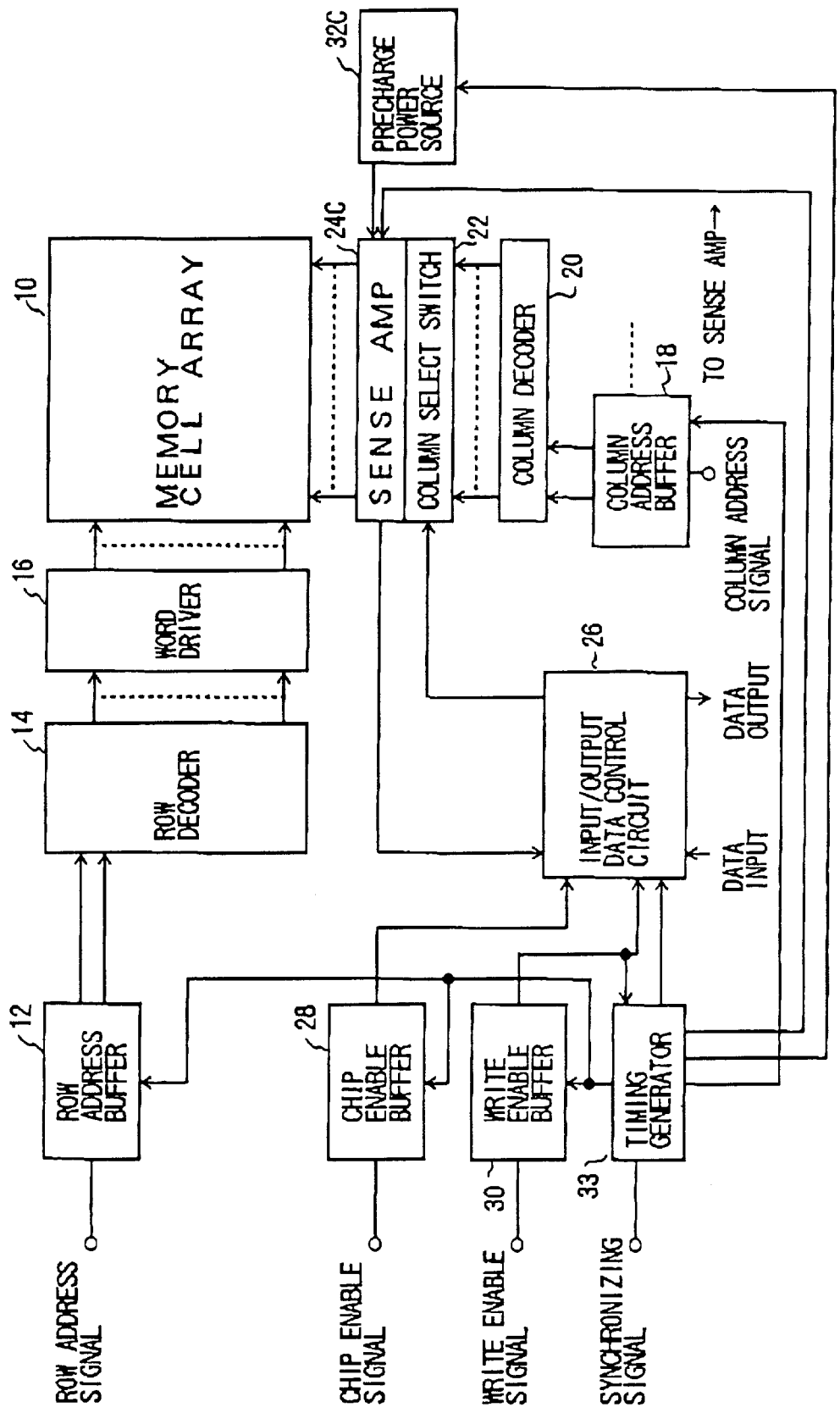
FIG. 1 is a block diagram of an overall structure of a conventional semiconductor memory device.

The overall structure of the semiconductor memory device is the same as shown in FIG. 1 except for the structures of the sense amplifier and the precharge power source.

Now, a description will be given of a sense amplifier 24A provided in the semiconductor memory device according to the first embodiment of the present invention.

Figure 4:
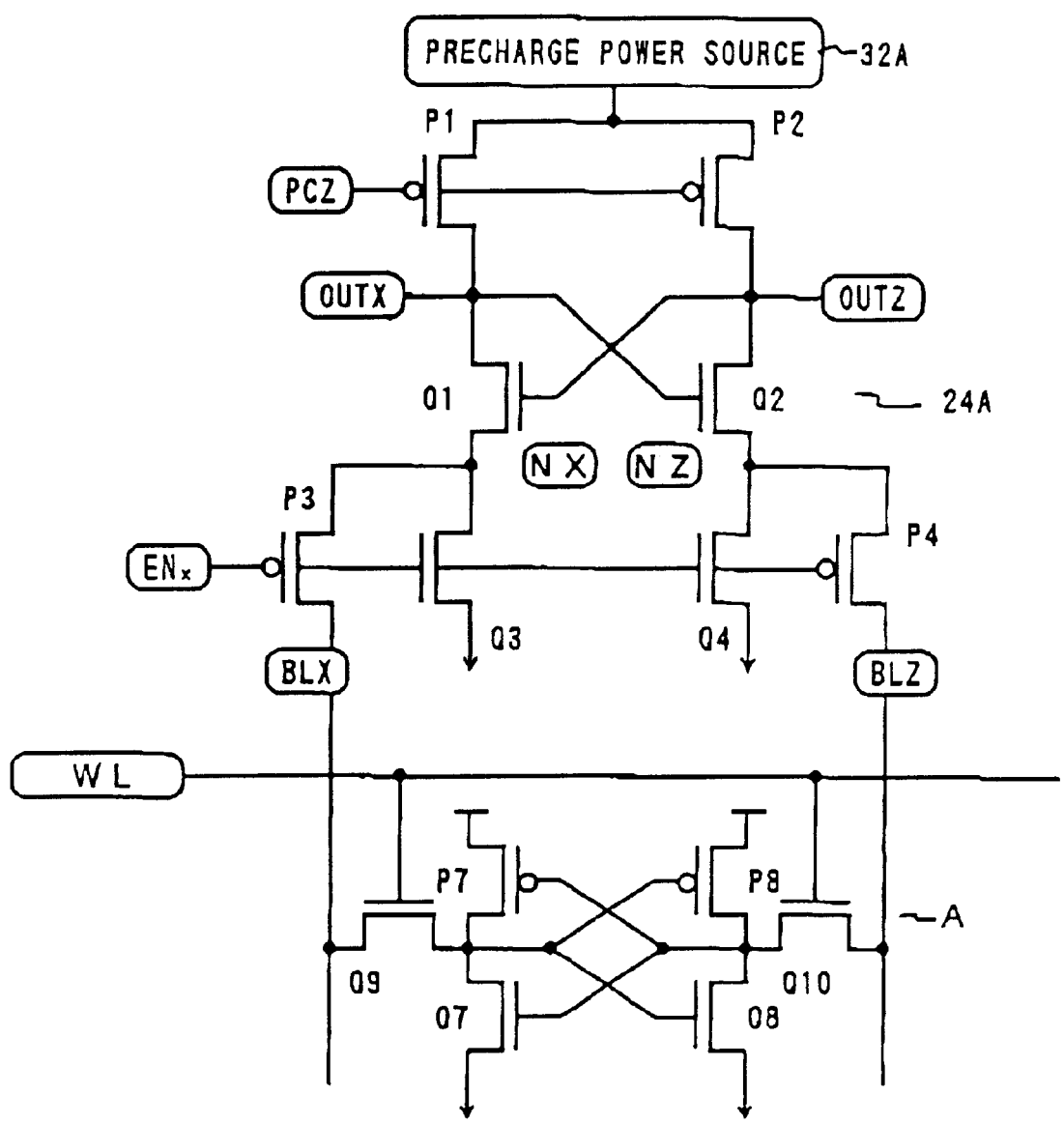
FIG. 4 is a circuit diagram of a sense amplifier related to a cell according to a first embodiment of the present invention.

FIG. 4 is a circuit diagram showing the sense amplifier 24A and a cell A connected to bit lines BLX and BLZ. The sense amplifier 24A includes nMOS transistors Q1, Q2, Q3 and Q4, and the cell A includes pMOS transistors P7 and P8 and nMOS transistors Q7, Q8, Q9 and Q10.

A precharge power source 32A applies a potential VCC-PC (for example, 1.5 V) to the sense amplifier 24A. The transistors P1 and P2 connected to the precharge power source 32A function to precharge the bit lines BLX and BLZ. The gates of the transistors P1 and P2 are supplied with the precharge control signal PCZ from the timing generator 33 shown in FIG. 1.

The gates of the transistors Q1 and Q2 are connected to the drains of the transistors Q2 and Q1, respectively, and form a flip-flop circuit. The sources of the transistors Q1 and Q2 are respectively connected to the nodes NX and NZ. The transistors Q1 and Q2 function as a dynamic latch.

The transistors P3 and P4 are used for column selecting and function as transfer gates to the bit lines BLX and BLZ which are paired.

The transistors Q3 and Q4 are pull-down transistors and the sources thereof are set at the ground potential GND. The sense enable signal ENx generated by the timing generators 33 shown in FIG. 1 is applied to the gates of the transistors P3, P4, Q3 and Q4. The drains of the transistors P3 and P4 are respectively connected to the bit lines BLX and BLZ. Data amplified by the sense amplifier 24A is output to the data output terminals OUTX and OUTZ.

Figure 2:
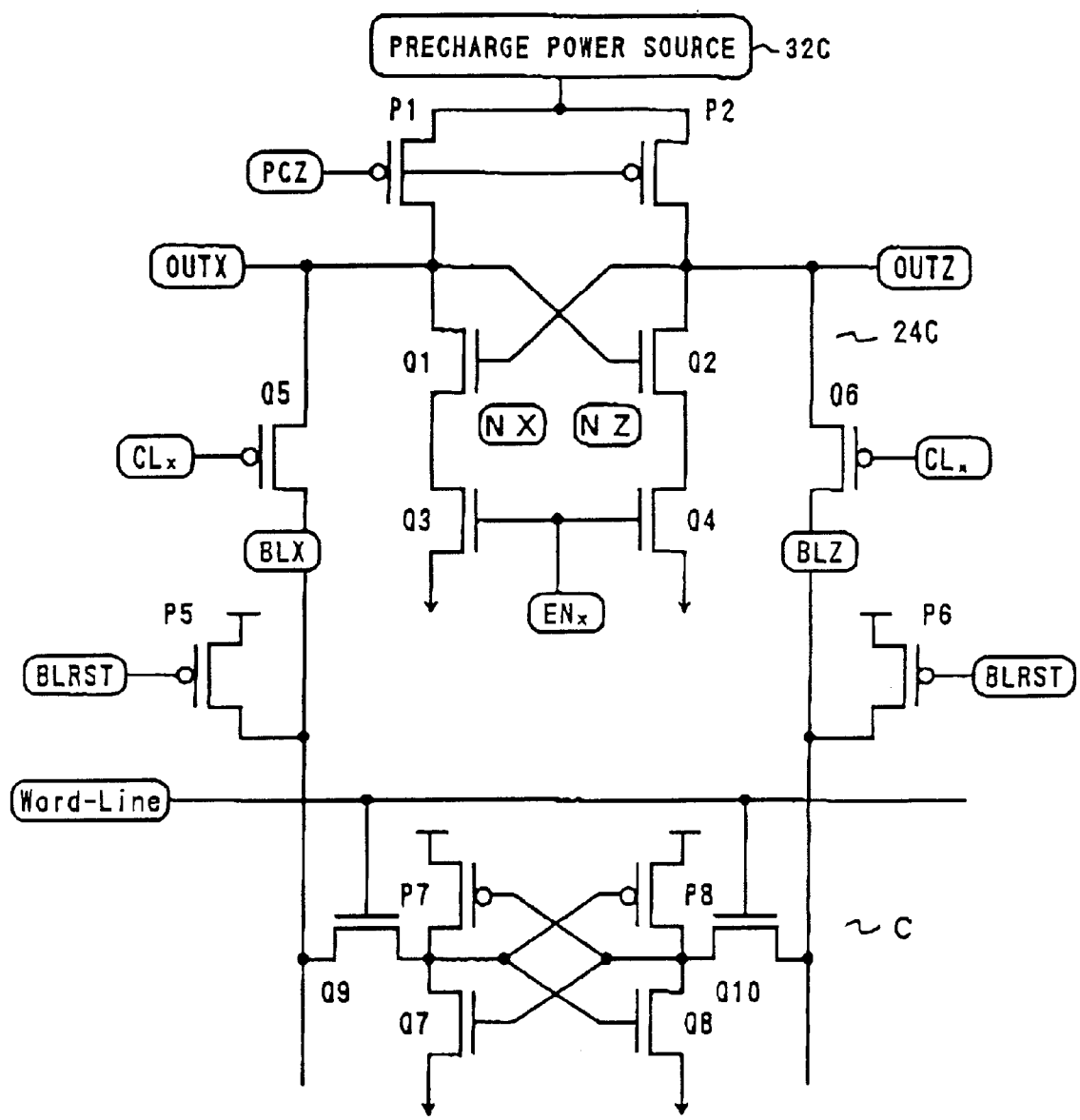
FIG. 2 is a circuit diagram of a memory cell and a related sense amplifier shown in FIG. 1.
Figure 3:
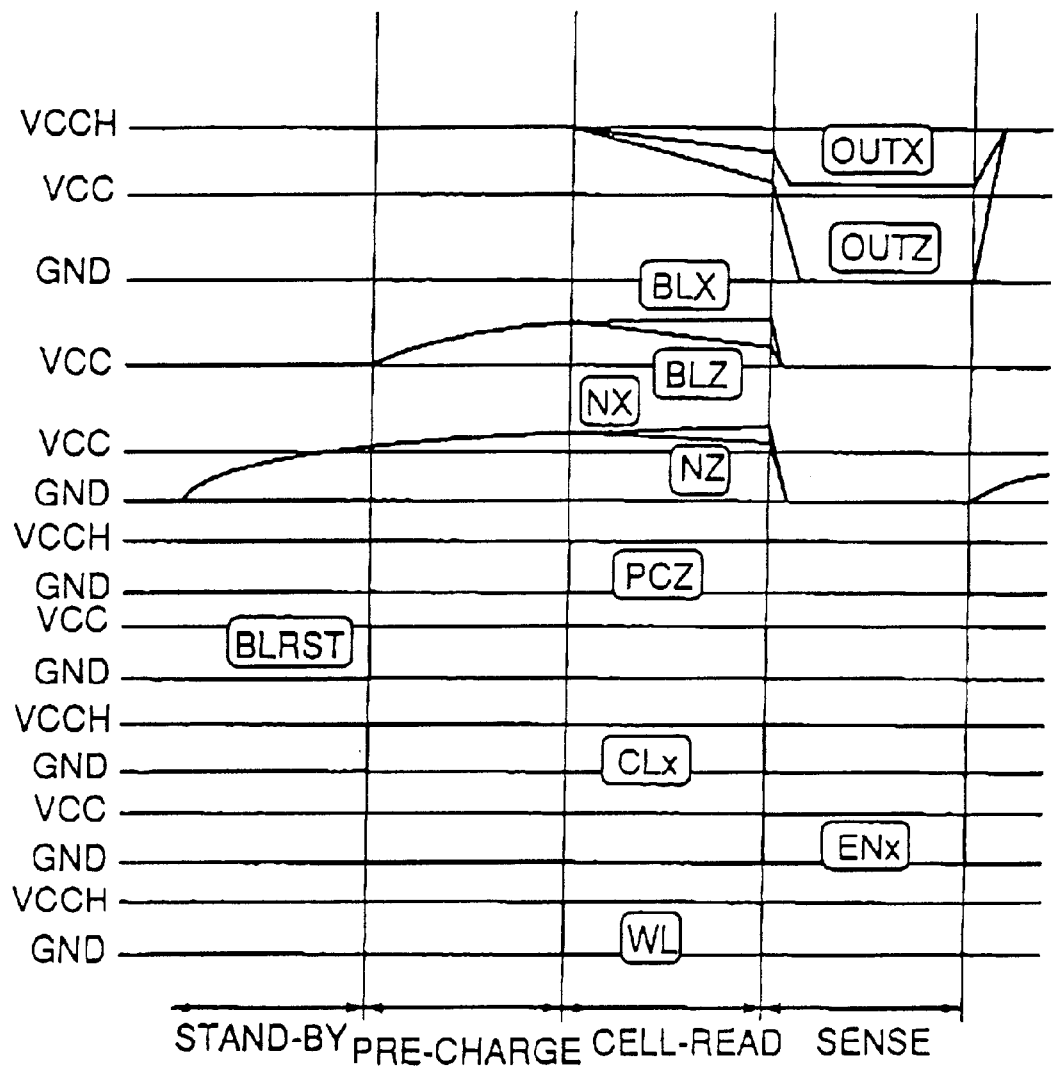
FIG. 3 is a timing chart showing an operation of the circuit shown in FIG. 2.

The transistors Q1 and Q2 of the sense amplifier 24A function as potential latch transistors and precharging transistors. Hence, a reduced number of transistors forms the sense amplifier and the parasitic capacitances are also reduced, as compared with the sense amplifier 24C shown in FIG. 2. Also, the gates of the transistors Q3, Q4, P3 and P4 are supplied with the identical signal. Hence, the single signal can pull down the voltages of the output terminals and isolate the bit lines from the sense amplifier 24A.

The cell A is made up of the transistors P7, Q7, P8 and Q8 forming a flip-flop circuit, and read/write transistors Q9 and Q10. The signal transferred over the word line is applied to the gates of the transistors Q9 and Q10 which are thus turned on. Thus, the potential of the bit line BLX or BLZ is pulled down in accordance with the state of the flip-flop circuit, so that data can be read from the cell A. Data can be written into the flip-flop circuit of the cell A when a large amplitude of the bit line potential difference is applied thereto via the transistors Q9 and Q10.

After the standby period, the sense amplifier 24A simultaneously performs the precharge operation and the cell read operation. The precharge operation precharges the capacitances coupled to the bit lines BLX and BLZ. In the cell read operation, data is read from the selected cell. During the sense period, the read data is amplified by the sense amplifier 24A.

Figure 5:
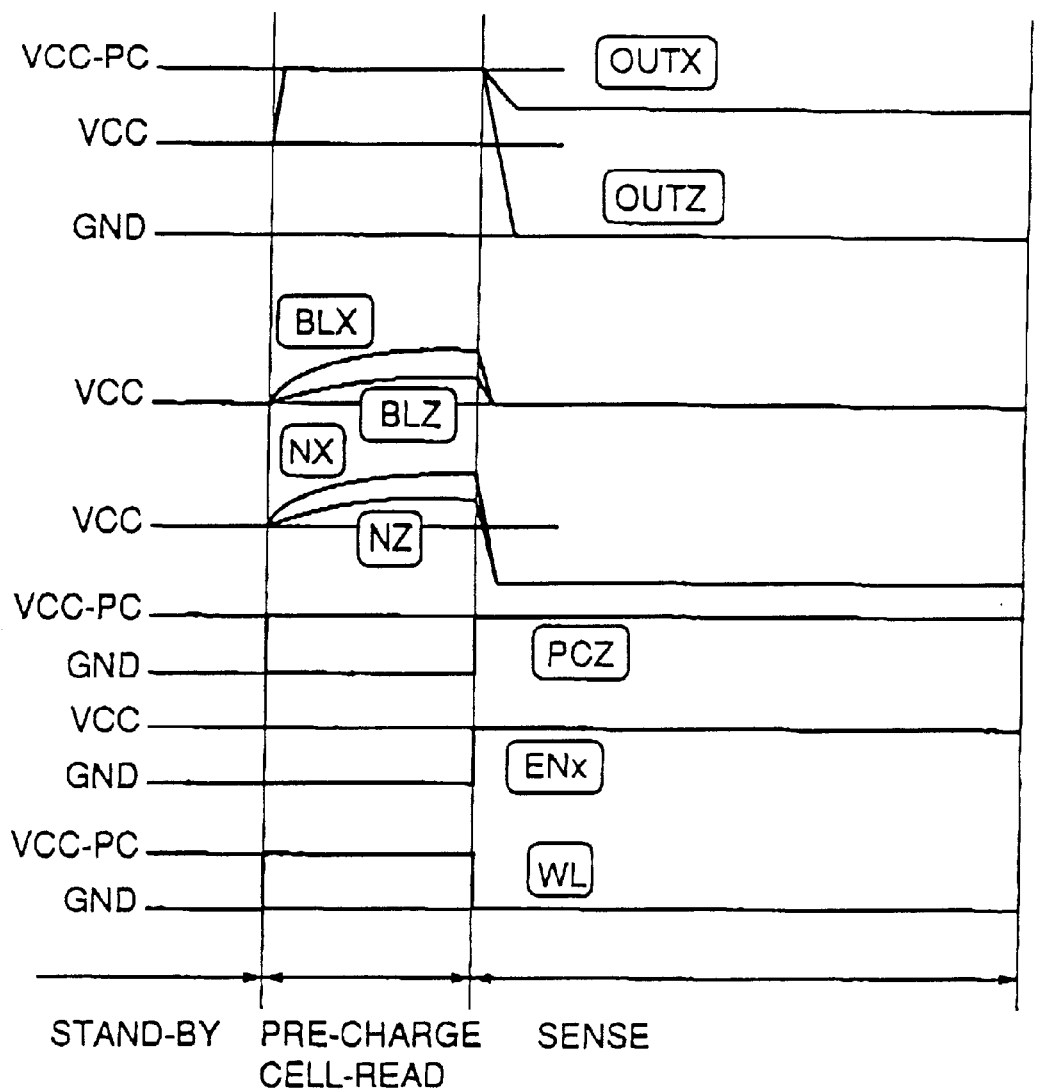
FIG. 5 is a timing chart showing an operation of the circuit shown in FIG. 4.

FIG. 5 shows an operation of the circuit shown in FIG. 4.

During the standby period, the output terminals OUTX and OUTZ, the bit lines BLX and BLZ and the nodes NX and NZ are at the potential VCC (for example, 1 V).

During the precharge/cell read period, the potential of the precharge control signal PCZ applied to the gates of the transistors P1 and P2 is set to zero (ground potential GND). At that time, the transistors P1 and P2 are turned on, and currents flow from the sources of the transistors P1 and P2 to the drains thereof. Hence, the output terminals OUTX and OUTZ connected to the drains of the transistors P1 and P2 are precharged to the potential VCCPC (>VCC).

In the state in which the output terminals OUTX and OUTZ have been precharged to the potential VCCPC, the transistors Q1 and Q2 function as a source-follower circuit. Thus, the potentials of the nodes NX and NZ connected to the sources of the transistors Q1 and Q2 are lower than the precharge power source voltage VCCPC by the threshold voltages Vth of the transistors Q1 and Q2. At that time, when the sense enable signal ENX is at the ground potential GND and the column select gates P3 and P4 are on, the bit lines BLX and BLZ are precharged.

When the potential VCCPC (high level) of the word line is applied to the cell A, which is thus selected, either the bit line BLX or the bit line BLZ is pulled down toward the grand potential GND by the current flowing in the cell A. If the potential of the bit line BLZ is decreased by the selected cell A, the potential of the node NZ becomes lower than that of the node NX.

In a case where the threshold voltage Vth of the transistor Q1 is different from that of the transistor Q2, the precharged potential of the node NX obtained when the precharging is completed will be different from the precharged potential of the node NZ if there is no cell current. However, the sources of the transistors Q1 and Q2 have been charged up to the potential that is lower than the precharge potential VCCPC by the threshold voltages Vth thereof. Hence, the transistor Q2 in which the cell current passes has the gate-source voltage VGS greater than the threshold voltage Vth, and is thus turned on. As a result, even if the nodes NX and NZ are at different potentials after the precharging, the on/off operations of the transistors Q1 and Q2 depend on the direction in which the cell current is drawn. Thus, the operation directed to compensating for the difference between the threshold voltages Vth of the transistors Q1 and Q2 can be performed.

During the sense period, when the potential of the precharge control signal PCZ applied to the gates of the transistors P1 and P2 is switched to the high level, the transistors P1 and P2 are turned off, and the precharging of the output terminals OUTX and OUTZ is stopped. If the data on the bit line is drawn to the cell A and the potentials of the bit line BLZ and the node NZ are slightly higher than those of the bit line BLZ and the node NX, the gate-source voltage VGS of the transistor Q2 will be greater than the threshold voltage Vth of the transistor Q2. Hence, current flows from the output terminal OUTZ to the node NZ via the transistor Q2. Thus, the potential of the output terminal OUTZ is rapidly decreased to the source potential of the transistor Q2.

When the potential of the output terminal OUTZ is decreased to the source potential of the transistor Q2, the gate of the transistor Q1 is decreased as well because the gate of the transistor Q1 is connected to the output terminal OUTZ. Hence, the gate-source voltage of the transistor Q1 becomes equal to or less than the threshold voltage Vth, and the transistor is turned off. Hence, no current flows from the output terminal OUTX to the node NX via the transistor Q1.

Hence, the output terminal OUTX coupled to the drain of the transistor Q1 is maintained at the precharge voltage VCCPC. In practice, a slight voltage drop will occur because the transistors Q1 and Q2 are gate-coupled in capacitance fashion. The potential difference between the output terminals OUTX and OUTZ is approximately equal to or greater than the mismatch value of the threshold voltage Vth.

Further, during the sense period, the sense enable signal ENx of the potential VCC (high level) is applied to the pull-down nMOS transistors Q3 and Q4. Hence, the transistors Q3 and Q4 are turned on, and current flows from the node NZ to the ground GND. Thus, the potential of the output terminal OUTZ is rapidly decreased to the ground GND.

In contrast, the gate potential of the transistor Q1 is decreased in accordance with a decrease in the potential of the output terminal OUTZ. Hence, the transistor Q1 is retained in the off state, and current does not flow from the drain of the transistor Q1 to the source thereof, whereby the potential of the output terminal OUTX is not dropped.

At the same time or slightly after the potential of the precharge control signal PCZ is returned to the high level, the potential of the word line is returned to the ground level GND, and power consumption by the cell current is stopped.

By the above-mentioned operation, the potential of the output terminal OUTX becomes a potential slightly higher than the potential VCC and becomes equal to, for example, 1.2 V. The potential of the output terminal OUTZ becomes the ground potential GND because the transistors Q2 and Q4 are turned on. Hence, the fine potential difference between the bit lines BLX and BLZ caused by the cell current is amplified by the dynamic latch operation of the transistors Q1 and Q2.

During the sense period, the sense enable signal ENx is set to the high-level potential VCC, and the transistors P3 and P4 are turned off. Hence, the bit lines BLX and BLZ are electrically isolated in order to prevent occurrence of variations In the bit line potentials. Hence, large amounts of the bit line load capacitances are isolated from the sense amplifier 24A, so that variations in the bit line potentials can be prevented and the sense amplifier 24A can perform the latch operation more rapidly and reduce the power consumption.

Since the precharge operation and the cell read operation are simultaneously carried out, a slight leakage current occurs during that period. As described before, the transistors Q1 and Q2 operate at operating points close to the threshold voltages Vth. Thus, only a very small amount of leakage current flows. That is, the most cell current is used to decrease the potentials of the nodes NX and NZ.

As described above, the sense amplifier 24A simultaneously performs the precharge operation and the cell read operation, so that the time it takes to read cell from the selected cell can drastically be reduced.

A description will now be given, with reference to FIGS. 6, 7 and 8, of a semiconductor memory device according to a second embodiment of the present invention. The overall structure of the semiconductor memory device according to the second embodiment of the present invention is as shown in FIG. 1 except for the sense amplifier and the precharge power source. The semiconductor memory device of the second embodiment is equipped with a cell B. which has the same circuit configuration as the cells A and C.

A sense amplifier 24B used in the second embodiment of the present invention is configured by modifying the sense amplifier 24A so that the column select signal CLz is applied to the column select gates formed of the transistors P3 and P4 separately from the sense enable signal ENx applied to the pull-down transistors Q3 and Q4. A precharge power source 32B applies a potential VCCH (for example, 1.5 V) higher than the potential VCC to the sense amplifier 24B only during the precharge period and the cell read period, and applies the potential VCC (for example, 1.0 V) during the other periods.

As in the case of the sense amplifier 24A, the sense amplifier 24B simultaneously performs, after the standby period, the precharging of the capacitances coupled to the bit lines BLX and BLZ and the cell read. The read data is amplified by the sense amplifier 24B during the sense period.

Figure 6:
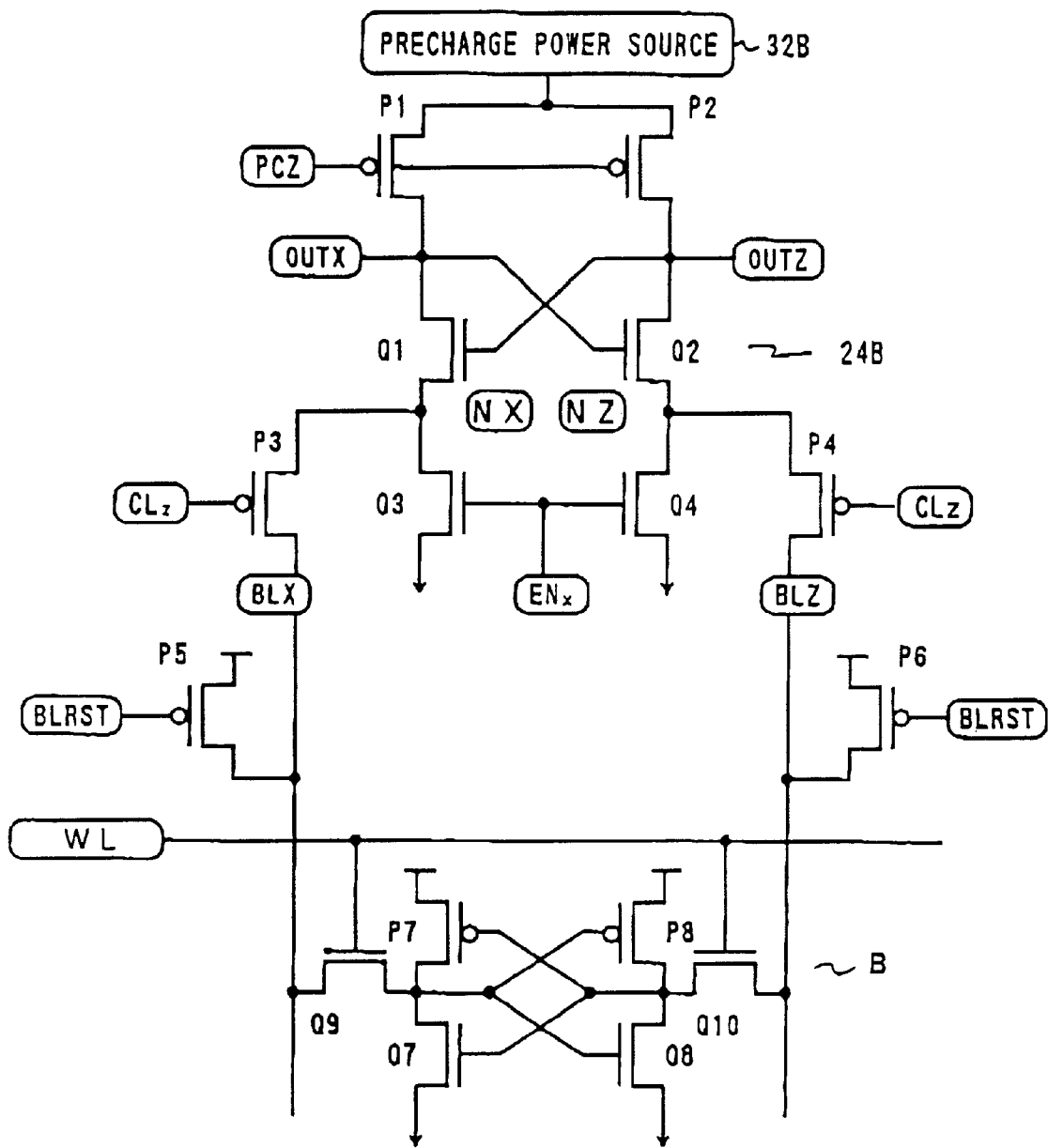
FIG. 6 is a circuit diagram of a sense amplifier related to a cell according to a second embodiment of the present invention.
Figure 7:
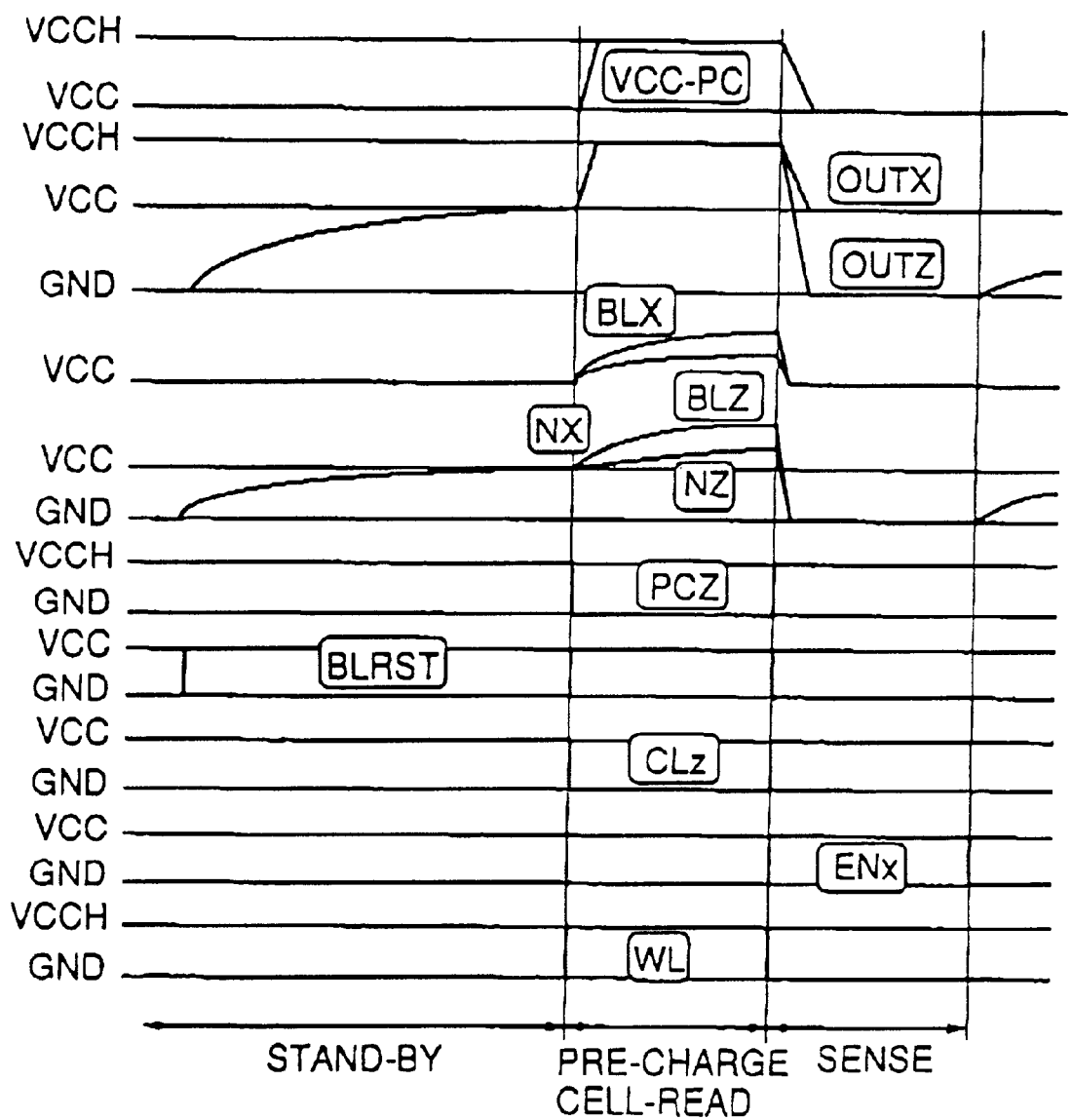
FIG. 7 is a timing chart showing an operation of the circuit shown in FIG. 6.

FIG. 7 shows an operation of the circuit shown in FIG. 6.

During the standby period, the precharge power source 32B, the bit lines BLX and BLZ and the column select signal are at the potential VCC (high level). The bit line control signal BLRST, the sense enable signal ENx and the word line WL are at the ground potential GND. The potential of the precharge control signal PCZ is at the potential VCCH (high level), and thus the transistors P1 and P2 are both off.

Since the precharge power source 32B and the bit lines BLX and BLZ are at the equal potential, it is possible to prevent leakage currents from respectively flowing in a route of the transistors P1, Q1 and P3 and a route of the transistors P2, Q2 and P4.

During the precharge/cell read period, the potential of the precharge control signal PCZ is decreased to the ground level GND, and thus the precharge transistors P1 and P2 are turned on. At that time, currents flow from the precharge power source 32B at the potential VCCH, and precharge the output terminals OUTX and OUTZ.

In the state in which the output terminals OUTX and OUTZ have been precharged to the potential VCCH, the transistors Q1 and Q2 function as a source-follower circuit. Thus, the potentials of the nodes NX and NZ coupled to the sources of the transistors Q1 and Q2 are lower than the precharge potential VCCH by the threshold voltages Vth of the transistors Q1 and Q2. Hence, if the column select signal CLz is at the ground potential GND and the transistors P3 and P4 are on, the transistors Q1 and Q2 function as nMOS bit line loads. When the potential of the word line WL becomes equal to the potential VCCH so that the cell B is selected, the bit line BLX or BLZ is pulled down to the ground potential GND due to the function of the cell current in accordance with the data stored in the cell B.

When the potential of the precharge control signal PCZ applied to the gates of the transistors P1 and P2 is switched to the potential VCCH, the transistors P1 and P2 are turned off, and the precharging of the output terminals OUTX and OUTZ are stopped. At that time, the potential of the precharge power source 32B is decreased to the potential VCC.

If the potentials of the bit line BLZ and the node NZ are slightly lower than the potentials of the bit line BLX and the node NX, the potential difference between the gate and source of the transistor Q2 is greater than the threshold voltage Vth, and thus current flows from the output terminal OUTZ to the node NZ via the drain and source of the transistor Q2. Hence, the potential of the output terminal OUTZ is rapidly decreased to the same potential as that of the source of the transistor Q2.

When the potential of the output terminal OUTZ is decreased to the same potential as that of the source of the transistor Q2, the gate of the transistor Q1 is also decreased because the above gate is connected to the output terminal OUTZ. Hence, the potential difference between the gate and source of the transistor Q2 becomes equal to or less than the threshold voltage Vth, and the transistor Q2 is turned off.

Hence, the output terminal OUTX coupled to the drain of the transistor Q1 is substantially maintained at the precharge potential VCCH. A slight voltage drop will occur because the transistors Q1 and Q2 are gate-coupled in capacitance fashion. The potential difference between the output terminals OUTX and OUTZ is approximately equal to or greater than the mismatch value of the threshold voltage Vth.

At that time, if the potential of the sense enable signal ENx is equal to the potential VCC, the pull-down transistors Q3 and Q4 are turned on, and current flows from the node NZ to the ground GND. Thus, the potential of the output terminal OUTZ is rapidly decreased. In contrast, the gate potential of the transistor Q1 is decreased in accordance with decrease in the potential of the output terminal OUTZ, and the transistor Q1 is retained in the off state. Hence no current flows from the drain of the transistor Q1 to the source thereof, and the potential of the output terminal OUTX is not decreased.

As described above, the output terminal OUTX is maintained at the potential VCC due to the dynamic operation of the transistors Q1 and Q2, while the output terminal OUTZ is changed to the ground potential. Simultaneously, the potential of the column select signal CLz of the potential VCC turns off the column select gates P3 and P4, so that the potentials of the bit lines BLX and BLZ can be prevented from being decreased.

The precharging operation and the cell read operation are simultaneously carried out, and the column select gates P3 and P4 are off. Hence, large amounts of the bit line load capacitances are isolated from the sense amplifier 24B, so that variations in the bit line potentials can be prevented and the sense amplifier 24B can perform the latch operation more rapidly and reduce the power consumption.

It will now be assumed that the transistors Q1 and Q2 of the circuit shown in FIG. 4 have a comparatively low threshold voltage Vth (for example, 0.2 V) for low-voltage use, while the potentials of the bit lines BLX and BLZ are VCC (1.0 V) and the precharge power source voltage is equal to 1.5 V. During the standby period, leakage currents approximately equal to 0.1 μm flows in a route of the transistors P1, Q1 and P3 and another route of the transistors P2, Q2 and P4. The read time is not affected by the transistors Q3 and Q4, transistors having a threshold voltage Vth of 0.4 V can be used to prevent occurrence of the leakage currents.

In contrast, the second embodiment is configured so that the precharge power source 32B and the bit lines BLX and BLZ are commonly equal to the potential VCC. Hence, no leakage currents flow in the route of the transistors P1, Q1 and P3 and the route of the transistors P2, Q2 and P4. Hence, the power consumption of the semiconductor memory device can be suppressed.

Figure 8:
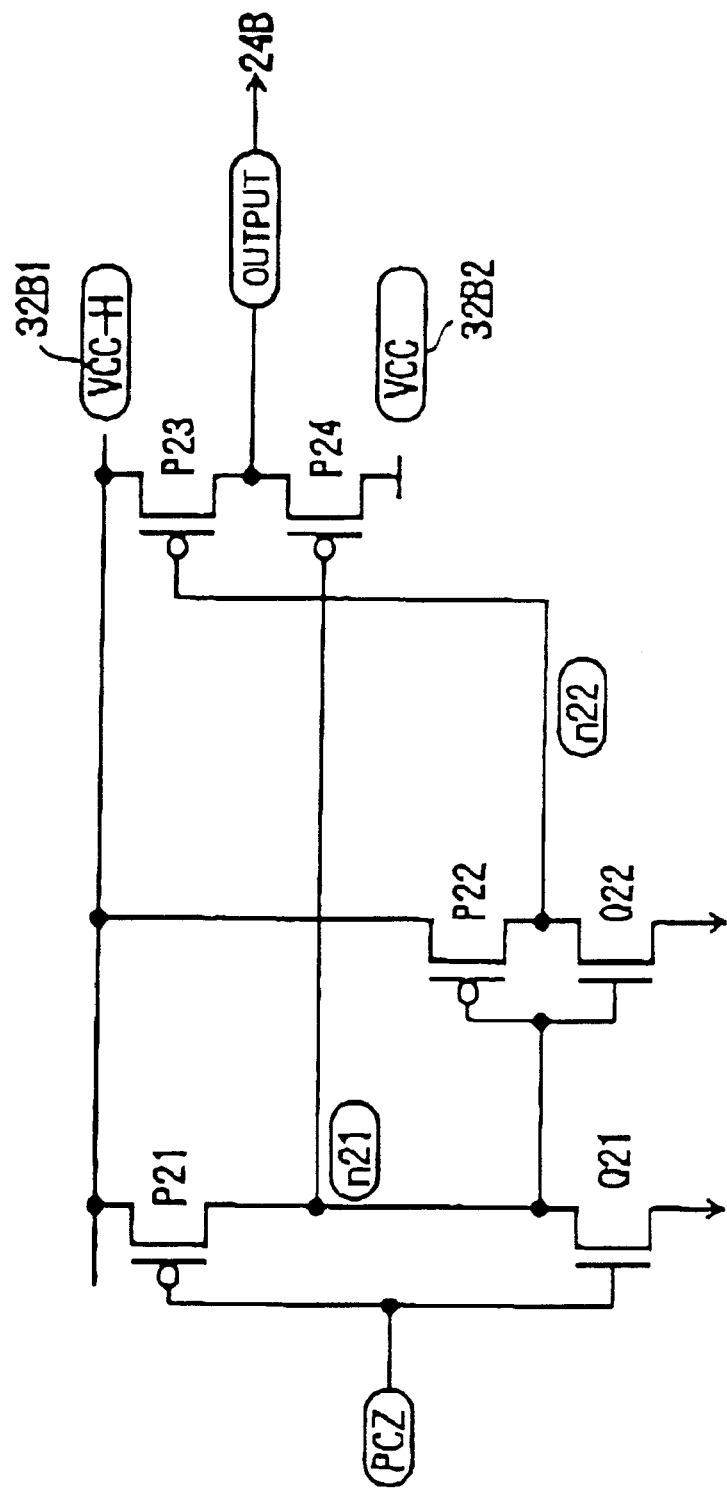
FIG. 8 is a circuit diagram of a precharge power source shown in FIG. 6.

The precharge power source 32B can be configured as shown in FIG. 8. The precharge power source 32B includes a power source 32B1 for generating the potential VCCH, and a power source 32B2 for generating the potential VCC. Either the generator 32B1 or the generator 32B2 is selected and is connected to the sense amplifier 24B via the output terminal. A node n21 is connected to the gate of a pMOS transistor P24. The node n21 corresponds to an output terminal of an inverter composed of a pMOS transistor P21 and an nMOS transistor Q21. A node n22 is connected to the gate of a PMOS transistor P23. The node n22 corresponds to an output terminal of an inverter composed of a pMOS transistor P22 and an nMOS transistor Q22.

When the potential of the precharge control signal PCZ is switched to the ground level GND in the precharging period, the transistor P21 is turned on and thus the node n21 is supplied with the power source 32B1 via the transistor P21. Hence, the potential of the node 21 becomes equal to VCCH. At that time, the transistor P24 is off.

Hence, if the potential of the node n21 becomes equal to VCCH (high level) during the precharging period, the transistor Q22 is turned on, and the potential of the node n22 is changed to the ground level GND. At that time, the transistor P23 having the gate connected to the node n22 is turned on, and the potential VCCH is thus applied to the sense amplifier 24B as the precharging power source.

During a period that is not the precharging period, the precharge control signal PCZ is at the potential VCCH (high level). Thus, the transistor Q21 is turned on and the potential of the node n21 is decreased to the ground level GND. At that time, the transistor P22 is turned on and the potential of the node n21 becomes equal to the ground level GND. Hence, the transistor P22 is turned on and the transistor P23 is turned off. Thus, the precharge power source output is disconnected from the power source 32B1. Since the potential of the node n21 becomes equal to the ground level GND, the transistor P24 is turned on and the potential VCC is applied to the sense amplifier 24B from the power source 32B2.

The present invention is not limited to the specifically disclosed embodiments, and variations and modifications may be made without departing from the scope of the present invention.

What is claimed is:

1. A semiconductor memory device comprising:
   a memory cell; and
   a dynamic latch type sense amplifier including transistors that form not only a dynamic latch circuit which holds or releases data but also charge transfer gates via which charges are applied to or received from bit lines,
   data being read from the cell connected to the bit lines at a same time as a precharging operation on the bit lines.

2. The semiconductor memory device as claimed in claim 1, further comprising a power source which applies a precharging potential to the bit lines at the time of precharging and applies a given potential lower than the precharging potential to the bit lines at a time other than the time of precharging.

3. The semiconductor memory device as claimed in claim 1, wherein said transistors are two transistors connected in cross-coupled formation with respect to the bit lines.

4. The semiconductor memory device as claimed in claim 2, wherein said transistors are two transistors connected in cross-coupled formation with respect to the bit lines.

5. A semiconductor memory device comprising:
   a memory cell; and
   a sense amplifier of a dynamic latch type including first and second n-channel transistors which have drains connected to first and second output terminals of the sense amplifier, respectively, gates connected to the second and first output terminals, respectively, and sources connected to first and second bit lines, respectively.

6. The semiconductor memory device as claimed in claim 5, wherein the sense amplifier further comprises third and fourth n-channel transistors which have gates receiving a common control signal, drains connected to the sources of the first and second n-channel transistors, respectively, and sources connected to a given potential.

7. The semiconductor memory device as claimed in claim 5, wherein the sense amplifier further comprises first and second p-channel transistors which have gates receiving a common control signal, sources connected to the sources of the first and second n-channel transistors, respectively, and drains connected to the first and second bit lines, respectively.

8. The semiconductor memory device as claimed in claim 6, wherein the sense amplifier further comprises first and second p-channel transistors which have gates receiving another common control signal, sources connected to the sources of the first and second n-channel transistors, respectively, and drains connected to the first and second bit lines, respectively.

9. The semiconductor memory device as claimed in claim 5, wherein the sense amplifier further comprises first and second p-channel transistors which have gates receiving a common column select signal, sources connected to the sources of the first and second n-channel transistors, respectively, and drains connected to the first and second bit lines, respectively.

10. The semiconductor memory device as claimed in claim 6, wherein the sense amplifier further comprises first and second p-channel transistors which have gates receiving a common column select signal, sources connected to the sources of the first and second n-channel transistors, respectively, and drains connected to the first and second bit lines, respectively.

11. The semiconductor memory device as claimed in claim 4, wherein the sense amplifier further comprises third and fourth p-channel transistors which have gates receiving a common precharge control signal, sources connected to a given power source, and drains connected to first and second output terminals of the sense amplifier, respectively.

12. The semiconductor memory device as claimed in claim 5, wherein the sense amplifier further comprises third and fourth p-channel transistors which have gates receiving a common precharge control signal, sources connected to first and second output terminals of the sense amplifier, respectively.

13. The semiconductor memory device as claimed in claim 6, wherein the sense amplifier further comprises third and fourth p-channel transistors which have gates receiving a common precharge control signal, sources connected to a given power source, and drains connected to first and second output terminals of the sense amplifier, respectively.

14. The semiconductor memory device as claimed in claim 1, wherein the cell is an SRAM cell.

15. The semiconductor memory device as claimed in claim 5, wherein the cell is an SRAM cell.

16. The semiconductor memory device as claimed in claim 11, further comprising a power source which applies a precharging potential to the bit lines at the time of precharging and applies a given potential different from the precharging potential to the bit lines at a time other than the time of precharging.

17. The semiconductor memory device as claimed in claim 12, further comprising a power source which applies a precharging potential to the bit lines at the time of precharging and applies a given potential different from the precharging potential to the bit lines at a time other than the time of precharging.

18. The semiconductor memory device as claimed in claim 13, further comprising a power source which applies a precharging potential to the bit lines at the time of precharging and applies a given potential different from the precharging potential to the bit lines at a time other than the time of precharging.

19. A semiconductor memory device comprising:

a memory cell; and a dynamic latch type sense amplifier, wherein said amplifier includes transistors that charge transfer gates, and wherein said charges are applied to, or received from, bit lines via the transistors at the same time data is being read from the memory cell connected to the bit lines.

* * * * *

UNITED STATES PATENT AND TRADEMARK OFFICE
CERTIFICATE OF CORRECTION

PATENT NO. : 6,292,418 B1
DATED : September 18, 2001
INVENTOR(S) : Shoichiro Kawashima et al.

Page 1 of 1

It is certified that error appears in the above-identified patent and that said Letters Patent is hereby corrected as shown below:

Title page,
Item [56] References Cited, under U.S. PATENT DOCUMENTS, please add the following references:

| | | |
|---|---|---|
| -- 4,123,799 | 11/1978 | Harduvel |
| 5,119,335 | 04/1993 | Arnold et al. |
| 5,202,854 | 04/1993 | Koike |
| 5,566,126 | 10/1996 | Yoshida -- |

Signed and Sealed this

Twenty-eighth Day of May, 2002

Attest:

Attesting Officer

JAMES E. ROGAN
Director of the United States Patent and Trademark Office